United States Patent

Lee et al.

[11] Patent Number: 6,069,039
[45] Date of Patent: May 30, 2000

[54] PLANE DECODE/VIRTUAL SECTOR ARCHITECTURE

[75] Inventors: Douglas J. Lee, San Jose; Sanjay Mehrotra, Milpitas; Mehrdad Mofidi; Daniel C. Guterman, both of Fremont, all of Calif.

[73] Assignee: SanDisk Corporation, Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/063,941

[22] Filed: Apr. 21, 1998

Related U.S. Application Data

[62] Division of application No. 08/719,179, Sep. 24, 1996, Pat. No. 5,798,968.

[51] Int. Cl.$^7$ .................................................. H01L 21/8247
[52] U.S. Cl. ................................................................ 438/258
[58] Field of Search ...................................... 438/257–267

[56] References Cited

U.S. PATENT DOCUMENTS

| | | |
|---|---|---|
| 4,426,764 | 1/1984 | Kosa et al. . |
| 4,818,718 | 4/1989 | Kosa et al. . |
| 5,095,344 | 3/1992 | Harari . |
| 5,163,021 | 11/1992 | Mehrotra et al. . |
| 5,172,338 | 12/1992 | Mehrotra et al. . |
| 5,245,566 | 9/1993 | Masuoka ................... 365/185.11 X |
| 5,297,148 | 3/1994 | Harari et al. . |
| 5,315,541 | 5/1994 | Harari et al. ............................ 365/63 |
| 5,396,468 | 3/1995 | Harari et al. . |
| 5,418,752 | 5/1995 | Harari et al. . |
| 5,504,450 | 4/1996 | McParland ................... 365/185.11 X |
| 5,657,332 | 8/1997 | Auclair et al. ......................... 365/184 |
| 5,677,872 | 10/1997 | Samachisa et al. ........... 365/185.33 X |

OTHER PUBLICATIONS

Bleiker et al., "A Four–State EEPROM Using Floating–Gate Memory Cells," *8107 I.E.E.E. Journal of Solid–State Circuits*, SC–22 (Jun. 1987) No. 3, New York, NY, USA.

Krick, "Three–State MNOS FET Memory Array," *IBM Technical Disclosure Bulletin*, vol. 18, No. 12, (May 1976) pp. 4192–4193.

Alberts et al., "Multi–Bit Storage FET EAROM Cell," *IBM Technical Disclosure Bulletin*, vol. 24, No. 7A (Dec. 1981) pp. 3311–3314.

*Primary Examiner*—Richard Booth
*Attorney, Agent, or Firm*—Majestic, Parsons, Siebert & Hsue

[57] ABSTRACT

An EEPROM device having a plurality of flash EEPROM cells organized in right and left half memory planes each having right and left quad memory blocks is described along with corresponding control circuitry including erase circuitry for concurrently erasing selected addressable data sectors of the EEPROM device. Included in the erase circuitry are a plurality of erase voltage generating circuits, a corresponding plurality of switching circuitry, and switch control circuitry shared by the plurality of switching circuitry for controlling the selectable coupling of erase voltages generated by the erase voltage generating circuits to corresponding data sectors of the EEPROM device. To minimize the die size of an integrated circuit including such an EEPROM device, the switching circuitry is formed adjacent elongated gap regions containing contacts for connecting buried diffusion regions of the plurality of flash EEPROM cells to parallel running metal lines to reduce the effective resistance of the bit lines comprising the buried diffusion regions.

8 Claims, 14 Drawing Sheets

PLANE DECODE/VIRTUAL SECTOR ARCHITECTURE

This is a division of application Ser. No. 08/719,179, filed Sep. 24, 1996, now U.S. Pat. No. 5,798,968.

BACKGROUND OF THE INVENTION

This invention relates in general to electrically erasable and programmable read-only-memory (EEPROM) devices and in particular, to the construction and operation of high density EEPROM devices and their erase circuitry.

High density EEPROM devices generally include a large array of EEPROM cells and circuitry for programming, erasing, and reading the array of EEPROM cells. A number of design objectives are considered when laying-out such a device in an integrated circuit (IC). General IC design objectives include minimizing the IC's die size to minimize its cost, and forming a square-shaped IC die to enhance the IC's manufacturability and as a consequence, to minimize its cost.

Application specific design objectives are also considered. For example, U.S. Pat. No. 5,297,148, which is incorporated herein by this reference, describes a flash EEPROM system which emulates a magnetic disk drive. Included in the flash EEPROM system are one or more EEPROM chips partitioned into sectors where all memory cells within a sector are erased together. Associated with each sector is an erase latch. Sectors to be erased are then "tagged" for erasure by an address decoder setting their corresponding erase latches.

There are a number of different ways in which the flash EEPROM cells of such an EEPROM chip can be physically organized. For example, the EEPROM cells may be organized into a sector-wide array, wherein each row of memory cells consisting of a sector of data may be erased together by connecting their erase gates to a common erase line and applying appropriate voltages to the EEPROM cells. An example of such an array is depicted in FIG. 1.

Another way of partitioning such an EEPROM chip is to organize its memory cells into an array which is a fraction of a sector wide. For example, if the array is half-a-sector wide, then by connecting the erase gates of the memory cells in a pair of rows together, the pair of rows of memory cells comprising a sector of data may be erased together.

Still another way of partitioning such an EEPROM chip is to organize its memory cells into an array which is two sectors wide. If the array is two sectors wide, then a first half of the memory cells comprising a first sector of data in each row may be connected together and accessed on one side of the array, and a second half of the memory cells comprising a second sector of data in each row may be connected together and accessed on an opposite side of the array.

It is generally impractical, however, to organize the memory cells into an array which is more than two sectors wide. For example, if the EEPROM chip is organized into a three sector wide array, then the first and third sectors of data respectively formed from the first and last thirds of the memory cells in each row by having their erase gates connected together, can be respectively accessed on opposite sides of the array, but access to the second sector of data formed from the middle (or second) third of the memory in each row by having its erase gates connected together, is difficult.

Accordingly, to facilitate concurrent erasure of tagged sectors of data in an EEPROM chip, the number of columns in the EEPROM chip's array of EEPROM cells may be practically limited to two sectors, a sector, or a fraction of a sector of data. As the size of such EEPROM cell arrays increase, however, with each new generation of high density flash EEPROM devices, it becomes increasingly more difficult to design such new generations so as to generally satisfy such columnar array structure requirement and the aforementioned general design considerations. In particular, by constraining the expansion of memory cells in only one direction (e.g., increasing the number of rows in such arrays, but not the number of columns), it becomes increasingly more difficult to lay-out such high density EEPROM chips in a square-shaped die.

OBJECTS AND SUMMARY OF THE INVENTION

Accordingly, one object of the present invention is an EEPROM structure for high density EEPROM devices useful in flash EEPROM systems emulating a hard disk drive, which generally satisfies such general and application specific design considerations as previously described.

This and additional objects are accomplished by the various aspects of the present invention, wherein briefly stated, one aspect of the invention is an EEPROM device including at least two subarrays of EEPROM cells (e.g., 100-1 and 100-2 in FIG. 5) sharing the same word lines, but having their own erase lines in order to facilitate simultaneous erasure of selected sectors of data respectively in the two subarrays. Included in the EEPROM device are a row decoder circuit (e.g., 502 and 522) coupled through a plurality of word lines to the control gates of EEPROM cells of corresponding rows of the two subarrays; a first erase circuit (e.g., 504, 506, 508, 512 and 514) coupled through a first plurality of erase lines to the erase gates of EEPROM cells of corresponding rows of a first one of the two subarrays; and a second erase circuit (e.g., 524, 526, 528, 516 and 518) coupled through a second plurality of erase lines to the erase gates of EEPROM cells of corresponding rows of a second one of the two subarrays.

In another aspect, an EEPROM structure formed on a semiconductor substrate comprises: first and second subarrays of EEPROM cells (e.g., 1016-2 and 1016-1, respectively, in FIG. 10) formed on the semiconductor substrate such that corresponding columns of the first and second subarrays of EEPROM cells are connected to common bit lines (e.g., 1012), and the first and second subarrays of EEPROM cells are separated by an elongated area (e.g., 1018-2) extending in a first direction substantially perpendicular to the common bit lines; and means (e.g., 506-2 and 512-2) substantially formed along a line extending in the first direction and through the elongated area, for switchably connecting an erase voltage to selected rows of the first subarray of EEPROM cells (e.g., 1016-2).

In another aspect, an EEPROM structure formed on a semiconductor substrate comprises: a first array (e.g., 100-1 of FIG. 5) of EEPROM cells individually having a drain electrode, a source electrode, a control gate, and an erase gate, and organized in a first plurality of rows and a first plurality of columns; a second array (e.g., 100-2) of EEPROM cells individually having a drain electrode, a source electrode, a control gate, and an erase gate, and organized in a second plurality of rows and a second plurality of columns; a plurality of word lines (e.g., 1201–1204 of FIGS. 12 and 16) extending in a first direction on the semiconductor substrate and individually connected to the control gates of EEPROM cells in corresponding rows of the first and second arrays of EEPROM cells; a first plurality of erase lines (e.g., 1251–1252 of FIG. 12) extending in the first direction and individually connected to the erase gates of EEPROM cells for storing a sector of data in the first array of EEPROM cells; a second plurality of erase lines (e.g., 1451–1452 of FIG. 14) extending in the second direction and individually connected to the erase gates of EEPROM cells for storing a sector of data in the second array of EEPROM cells; means (e.g., 506) formed adjacent to a left side of the first array of EEPROM cells (e.g., 100-1), for switchably connecting an erase voltage to selected erase lines of a first half of the first plurality of erase lines; means (e.g., 512) formed adjacent to a right side of the first array of EEPROM cells (e.g., 100-1), for switchably connecting an erase voltage to selected erase lines of a second half of the first plurality of erase lines; means (e.g., 516) formed adjacent to a left side of the second array of EEPROM cells (e.g., 100-2), for switchably connecting an erase voltage to selected erase lines of a first half of the second plurality of erase lines; and means (e.g., 526) formed adjacent to a right side of the second array of EEPROM cells (e.g., 100-2), for switchably connecting an erase voltage to selected erase lines of a second half of the second plurality of erase lines.

In still another aspect, an EEPROM structure formed on a semiconductor substrate includes a diffusion region (e.g., 1012 in FIG. 10) extending in a first direction on the semiconductor substrate; a plurality of EEPROM cells sharing the diffusion region such that the diffusion region acts as a buried diffusion bit line for the plurality of EEPROM cells; a contact (e.g., 1020-2) formed above and extending down to the diffusion region; a plurality of conductive strips (e.g., 1251–1252 in FIG. 12) respectively coupled to corresponding ones of the plurality of EEPROM cells, and extending in a second direction transverse to the first direction on the semiconductor substrate; and a plurality of transistors (e.g., 506) coupled to corresponding ones of the plurality of conductive strips, and formed substantially along a line extending in the second direction through the contact (e.g., 1020-2).

In yet another aspect, a method of forming an EEPROM structure comprises: forming a first diffusion region (e.g., 1012 in FIG. 10) extending in a first direction on a semiconductor substrate; forming a column of EEPROM cells sharing the first diffusion region such that the column of EEPROM cells includes a first and a second group of EEPROM cells (e.g., 1016-2 and 1016-1) separated by a group spacing (e.g., 1018-2) greater than individual spacings between adjacent EEPROM cells of the first and second groups of EEPROM cells; forming a plurality of transistors (e.g., 506-2) substantially along a line extending through the group spacing between the first and second groups of EEPROM cells in a second direction transverse to the first direction on the semiconductor substrate; forming a first plurality of conductive strips (e.g., 1251–1252 in FIG. 12) extending in the second direction and respectively connected to corresponding ones of the first plurality of EEPROM cells; and forming a second plurality of conductive strips (e.g., 1111–1112 in FIGS. 11 and 12) connected to corresponding ones of the first plurality of conductive strips and to corresponding ones of the plurality of transistors.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
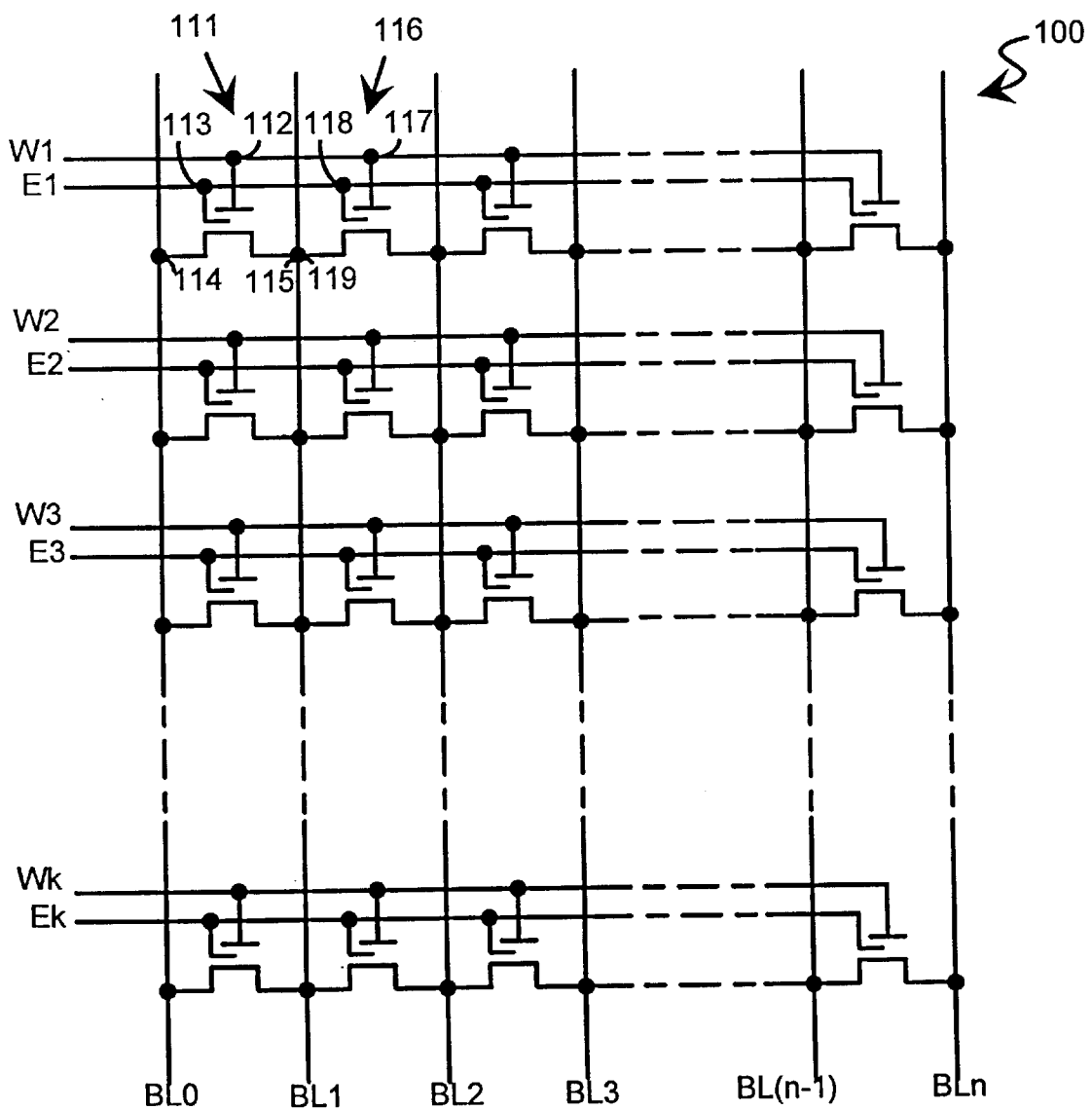
FIG. 1 illustrates, as an example, a schematic of a virtual ground EEPROM array.

FIG. 1 illustrates, as an example, a schematic of a virtual ground EEPROM array 100 comprising a plurality of EEPROM cells (e.g., 111) organized in a k×n matrix of rows and columns. In each row of EEPROM cells, the control gates (e.g., 112 and 117) of the EEPROM cells (e.g., 111 and 116) are connected to a common word line (e.g., W1), the erase gates (e.g., 113 and 118) of the EEPROM cells (e.g., 111 and 116) are connected to a common erase line (e.g., E1), and a source or drain (e.g., 115) of each of the EEPROM cells (e.g., 111) is connected to a source or drain (e.g., 119) of an adjacent EEPROM cell (e.g., 116). In each column of EEPROM cells, the sources (e.g., 114) of the EEPROM cells (e.g., 111) are connected to a common bit line (e.g., BL0) referred to herein as a source line, and the drains (e.g., 115) of the EEPROM cells (e.g., 111) are connected to another common bit line (e.g., BL1) referred to herein as a drain line. By applying appropriate voltages to the word lines W1-Wk, erase lines E1-Ek, and bit lines BL0-BLn of the EEPROM cell array 100, the EEPROM cells can be programmed, read, and erased. For additional details on the operation and physical structure of such virtual ground EEPROM arrays, see, for example, U.S. Pat. No. 5,095,344, entitled "Highly Compact EPROM and Flash EEPROM Devices," which is incorporated herein by this reference.

Figure 2:
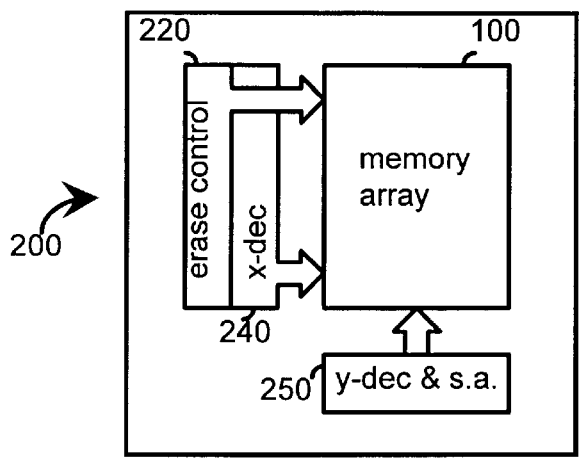
FIG. 2 illustrates, as an example, a simplified top plan view of a square-shaped EEPROM IC die having an array of EEPROM cells.

FIG. 2 illustrates, as an example, a simplified top plan view of an integrated circuit die 200 including the EEPROM array 100, a row decoder circuit 240, an erase control circuit 220, and a column decoder and sense amplifier circuit 250. In response to control signals and an address provided by a controller (not shown), the row decoder circuit 240 generates the appropriate voltages to the word lines W1-Wk, the erase control circuit 220 provides the appropriate voltages to the erase lines E1-Ek, and the column decoder of the column decoder and sense amplifier circuit 250 provides the appropriate voltages to the bit lines BL0-BLn to program, erase, or read selected EEPROM cells of the EEPROM cell array 100. The sense amplifiers of the column decoder and sense amplifier circuit 250 sense the currents flowing through the selected EEPROM cells of the EEPROM cell array 100 in order to read their programmed states.

Figure 3:
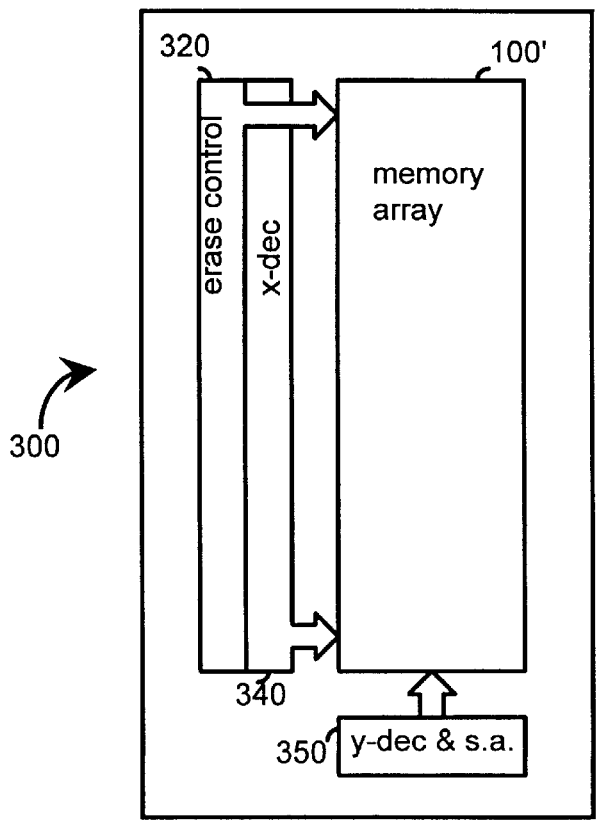
FIG. 3 illustrates, as an example, a simplified top plan view of a rectangular-shaped EEPROM IC die having an array of EEPROM cells twice as large as that of the square-shaped EEPROM IC die of FIG. 2.

The integrated circuit die 200 is preferably square-shaped, as shown in FIG. 2, for example, to optimize its area efficiency and therefore, its manufacturability. As the size of the EEPROM array gets larger, however, the resulting integrated circuit die may become rectangular-shaped, as shown in FIG. 3, for example, because the EEPROM array may be restricted from expanding in one or another direction. For example, in a flash EEPROM system including control circuitry to emulate a hard disk drive and one or more EEPROM devices to store data, the number of columns in the EEPROM arrays (e.g., 100') of the EEPROM devices (e.g., 300) may be restricted to a sector of data (e.g., 512 bytes) or a fraction of a sector (e.g., one-half or one-fourth of a sector) so that single sector-at-a-time manipulation of the data stored in the EEPROM devices may be facilitated. In such a case, it may be preferable to form such EEPROM devices with two or more subarrays rather than a single, long array so that their integrated circuit dies may be square-shaped to enhance its area efficiency and therefore, its manufacturability.

Figure 4:
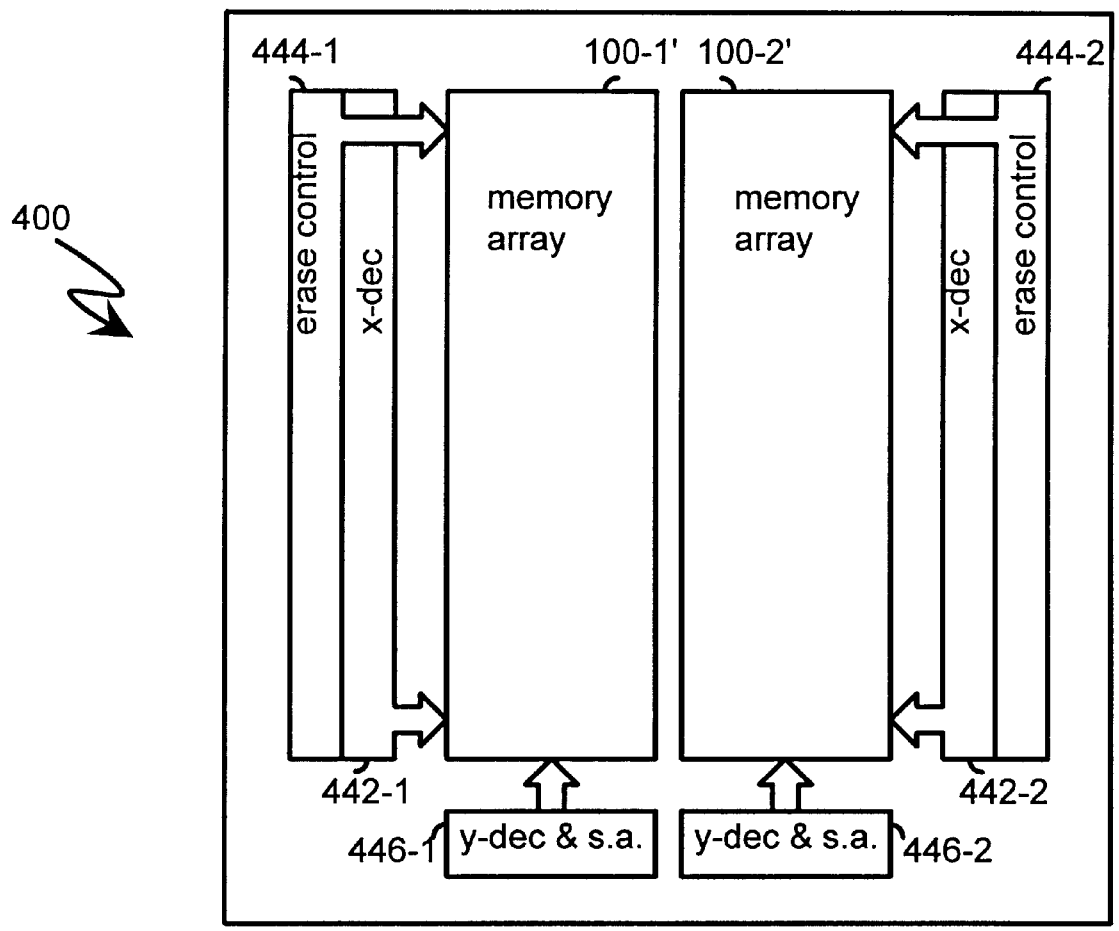
FIG. 4 illustrates, as an example, a simplified top plan view of a square-shaped EEPROM IC die having a plurality of EEPROM cells twice as many as the array of EEPROM cells of the square-shaped EEPROM IC die of FIG. 2, and partitioned into two subarrays.

In FIG. 4, for example, an integrated circuit die 400 includes two subarrays, 100-1' and 100-2', wherein each subarray has the same number of columns as the EEPROM array 100' of the integrated circuit die 300 and a selected number of rows so that the integrated circuit die 400 results in being more square-shaped relative to the rectangular-shaped integrated circuit die 300. To program, erase, and read data from the two subarrays, 100-1' and 100-2', each subarray (e.g., 100-1') has its own row decoder circuit (e.g., 442-1), erase control circuit (e.g., 444-1), and column decoder and sense amplifier circuit (e.g., 446-1) associated with it.

A number of changes to the structure and layout of the integrated circuit die 400 are desirable, however, for simplifying its construction and operation, and therefore, its manufacturing and operating costs. In particular, although the number of columns in each subarray may be constrained in order to promote erasure of addressable sectors of data with a specified sector size, there may not be a similar constraint for the reading or writing of data from or to each subarray. Therefore, it is advantageous to eliminate one of the row decoder circuits (e.g., 442-2), and connect the remaining row decoder circuit (e.g., 442-1) to each of the control gates of EEPROM cells in corresponding rows of both subarrays 100-1' and 100-2'. It is also desirable to minimize the number of wires extending out of one side of each subarray to avoid routing problems in the layout of the integrated circuit die. Additionally, it is also desirable to reduce the number of erase latches employed in the erase control circuits 444-1 and 444-2.

Figure 5:
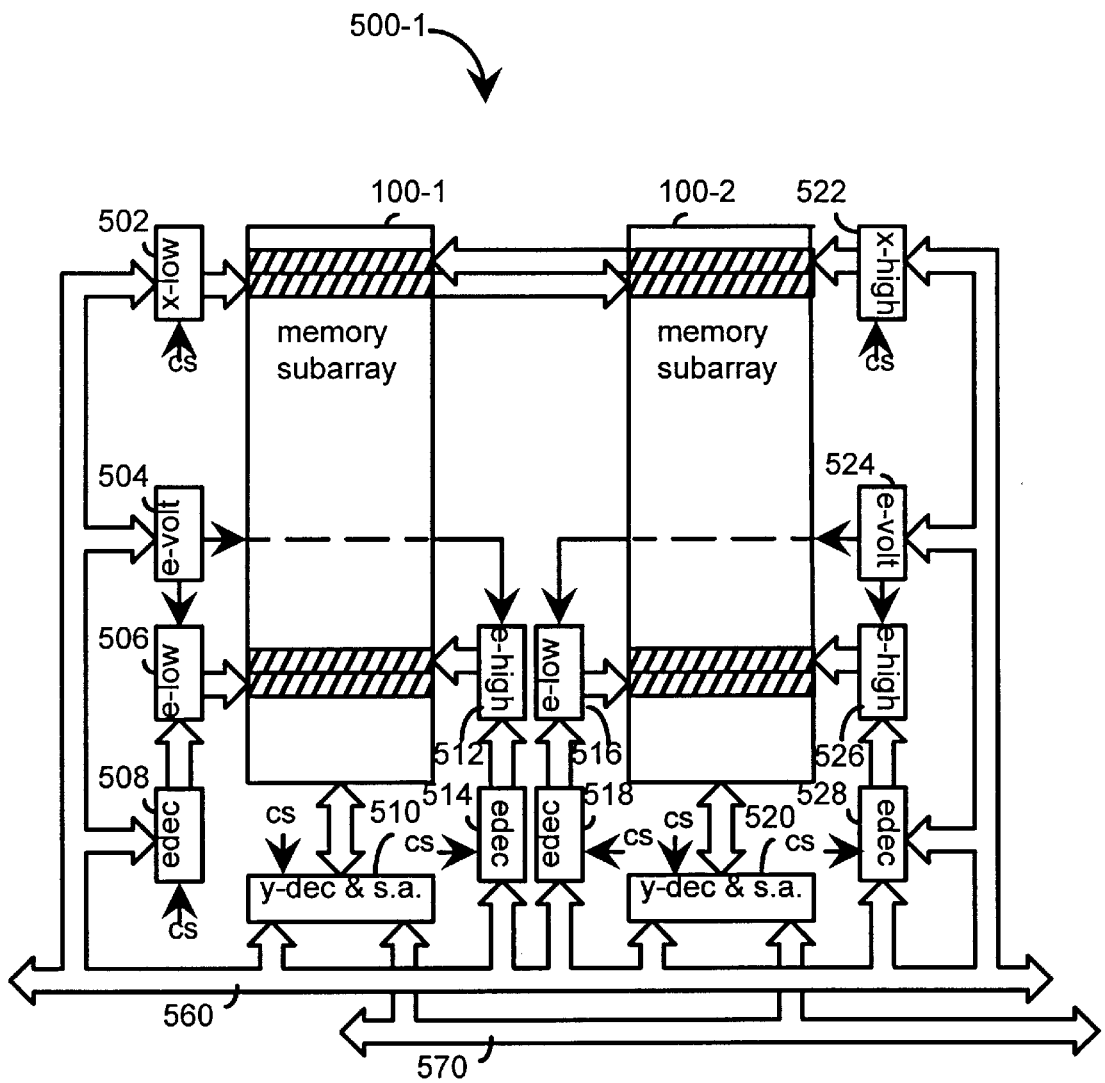
FIG. 5 illustrates, as an example, a simplified lay-out of a left plane portion of a high density EEPROM device, utilizing aspects of the present invention.

FIG. 5 illustrates, as an example, a simplified lay-out of a portion of a high density EEPROM device having its EEPROM memory cells organized into pairs of memory blocks or subarrays such as the subarray pair, 100-1 and 100-2. By laying out the subarray pairs side-by-side, an approximately square shaped die can be formed by adjusting, as appropriate, the number of rows in each of the subarray pairs along with the number of subarray pairs. In an exemplary high density EEPROM device, for example, two such subarray pairs are employed side-by-side, wherein the first and second subarray pairs are respectively referred to as the left and right planes, and each of the subarrays in the two subarray pairs is individually referred to as a quad. Although each of the quads may be constructed having one row per sector of data as the virtual ground EEPROM array 100 in FIG. 1, in the exemplary high density device, the quads are constructed having two rows per sector of data so that each of their erase lines is shared between two rows of memory cells. Since the right and left planes are merely mirror images or replicas of each other, only a left plane 500-1 is depicted in FIG. 5.

In each pair of memory blocks, corresponding word lines of the memory blocks are connected together. For example, all of the control gates of the EEPROM cells in a row of the memory block 100-1 and all of the control gates of the EEPROM cells in a corresponding row of the memory block 100-2 are connected to a common word line running through memory blocks 100-1 and 100-2. Corresponding erase lines of the memory blocks, however, are not connected together. For example, all of the erase gates of the EEPROM cells in pairs of two adjacent rows of the memory block 100-1 are connected to a common erase line, and all of the erase gates of the EEPROM cells in the corresponding two rows of the memory block 100-2 are connected to a different common erase line.

The rows of each memory block are partitioned into sets of rows such as 8, 16, 32 or 64 rows, and each set of rows is further partitioned into a lower half and a higher (or upper) half of rows to facilitate driving of the rows. For example, if the rows of each memory block are partitioned into sets of 32 rows, then the first 16 rows (e.g., rows 0 to 15) would be designated the lower half of rows for the first set, and the next 16 rows would be designated the upper half of rows (e.g., rows 16 to 31) for the first set. As previously described, each row in each memory block (e.g., 100-1 or 100-2) consists of one-half sector of data so that two adjacent rows contain a sector of data. Accordingly, each set of 32 rows includes 16 data sectors, wherein the data sectors corresponding to the lower half of rows of the set are designated as the lower data sectors, and the data sectors corresponding to the upper half of rows of the set are designated as the upper data sectors of the set. Spacing gaps may exist between each set of rows for a number of reasons such as will be subsequently discussed.

Row drive circuitry (x-low) 502 decode addresses received from an address bus 560 and provide appropriate control gate voltages in response to control signals CS to the lower half rows of each set of rows in the pair of memory blocks 100-1 and 100-2, and row drive circuitry (x-high) 522 also decode addresses received from the address bus 560 and provide appropriate control gate voltages in response to control signals CS to the upper half rows of each set of rows in the pair of memory blocks 100-1 and 100-2 for programming, erasing and reading the memory cells in the memory blocks 100-1 and 100-2.

Erase circuitry for the memory block 100-1 include erase voltage generating circuitry (e-volt) 504, left-side switch circuitry (e-low) 506, right-side switch circuitry (e-high) 512, left-side switch control circuitry (edec) 508, and right-side switch control circuitry (edec) 514. The left- and right-side switch circuitry (e-low) and (e-high), 506 and 512, respectively selectively couple the erase voltages generated by the erase voltage generating circuitry (e-volt) 504 to corresponding erase lines in respectively, lower and upper halves of each set of erase lines in the memory block 100-1, wherein such selective coupling is respectively controlled by the left- and right-side switch control circuitry (edec), 508 and 514.

Likewise, erase circuitry for the memory block 100-2 include erase voltage generating circuitry (e-volt) 524, left-side switch circuitry (e-low) 516, right-side switch circuitry (e-high) 526, left-side switch control circuitry (edec) 518, and right-side switch control circuitry (edec) 528. The left- and right-side switch circuitry (e-low) and (e-high), 516 and 526, respectively selectively couple the erase voltages generated by the erase voltage generating circuitry (e-volt) 524 to corresponding erase lines in respectively, lower and upper halves of each set of erase lines in the memory block 100-2, wherein such selective coupling is respectively controlled by the left- and right-side switch control circuitry (edec), 518 and 528.

Other circuitry include conventional column decoder and sense amplifier circuitry 510 responsive to addresses received from the address bus 560, for reading and writing data from and to the memory block 100-1, column decoder and sense amplifier circuitry 520 responsive to addresses received from the address bus 560, for reading and writing data from and to the memory block 100-2, and data bus 570 for communicating the data being read or written to the memory blocks 100-1 and 100-2 through the column decoder and sense amplifier circuitry, 510 and 520. A right plane 500-2 (not shown) would also be coupled to the address bus 560 and data bus 570 to communicate data from its respective memory blocks to a host processor (not shown) or other device coupled to the address bus 560 and data bus 570.

Figure 6:
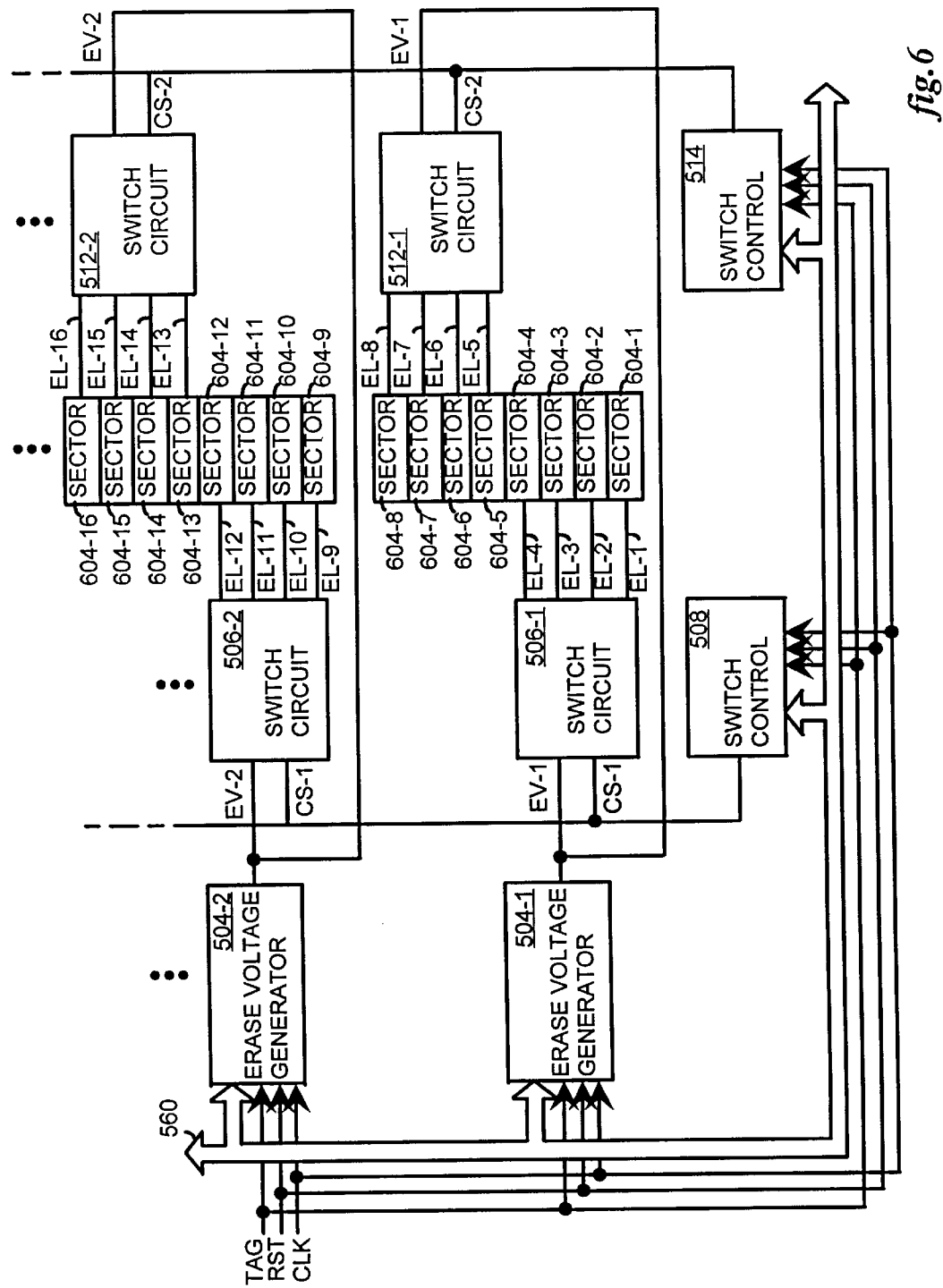
FIG. 6 illustrates, as an example, a block diagram of a left-hand side portion of the left plane of the high density EEPROM device of FIG. 5, utilizing aspects of the present invention.

FIG. 6 illustrates, as an example, a block diagram of a portion of the erase circuitry for the memory block 100-1. For illustrative purposes, the memory block 100-1 is shown organized into sets of eight data sectors each. It is to be understood, however, that the memory block 100-1 could also be organized into sets of less than or more than eight data sectors. For example, memory blocks organized into sets of sixteen (16), thirty-two (32) or sixty-four (64) data sectors are especially useful in practice. Corresponding erase circuitry for the memory block 100-2 is substantially identical in construction and operation, and therefore, a description of such circuitry is omitted to avoid unnecessary repetition. The number of data sectors is determined by the size of the memory block 100-1, and the size of each data sector.

The erase voltage generating circuitry (e-volt) 504 comprises a plurality of erase voltage generating circuits, 504-1, 504-2 and so on, individually shared by a set of data sectors of the memory block 100-1. For example, erase voltage generating circuit 504-1 is shared by the set of data sectors 604-1 to 604-8, and erase voltage generating circuit 504-2 is shared by the set of data sectors 604-9 to 604-16. Likewise, the left-side switch circuitry (e-low) 506 comprises a plurality of left-side switch circuits, 506-1, 506-2 and so on, and the right-side switch circuitry (e-high) 512 comprises a plurality of right-side switch circuits, 512-1, 512-2 and so on, wherein corresponding left-side and right-side switch circuits are shared by a set of data sectors of the memory block 100-1. For examples, left-side switch circuit 506-1 and corresponding right-side switch circuit 512-1 are shared by the set of data sectors 604-1 to 604-8, and left-side switch circuit 506-2 and corresponding right-side switch circuit 512-2 are shared by the set of data sectors 604-9 to 604-16.

As previously described, the erase gates of the EEPROM cells in each data sector are connected together through a common erase line. Accordingly, each set of data sectors (e.g., the set including data sectors 604-1 to 604-8) has lower (e.g., EL-1 to EL-4) and upper (e.g., EL-5 to EL-8) erase lines respectively coupled to its lower (e.g., 604-1 to 604-4) and upper (e.g., 604-5 to 604-8) data sectors. Each set of data sectors also has its own erase voltage generating circuit (e.g., 504-1) for generating an erase voltage (e.g., EV-1) suitable for erasing programmed states of its EEPROM cells, and left-side (e.g., 506-1) and right-side (e.g., 512-1) switch circuits for coupling the generated erase voltage (e.g., EV-1) respectively to selected ones of the lower (e.g., EL-1 to EL-4) and upper (e.g., EL-5 to EL-8) erase lines.

The left-side switch control circuitry (e-low) 508 provides control signals CS-1 to individual ones of the plurality of left-side switch control circuits (e.g., 506-1, 506-2 and so on) to cause the plurality of left-side switch control circuits (e.g., 506-1, 506-2 and so on) to selectively couple their corresponding erase voltages (e.g., EV-1, EV-2 and so on) respectively to selected ones of their corresponding lower erase lines (e.g., EL-1 to EL-4, EL-9 to EL-12 and so on), and the right-side switch control circuitry (e-high) 514 provides control signals CS-2 to individual ones of the plurality of right-side switch control circuits (e.g., 512-1, 512-2 and so on) to cause the plurality of right-side switch control circuits (e.g., 512-1, 512-2 and so on) to selectively couple their corresponding erase voltages (e.g., EV-1, EV-2 and so on) respectively to selected ones of their corresponding upper erase lines (e.g., EL-5 to EL-8, EL-13 to EL-16 and so on).

Figure 7:
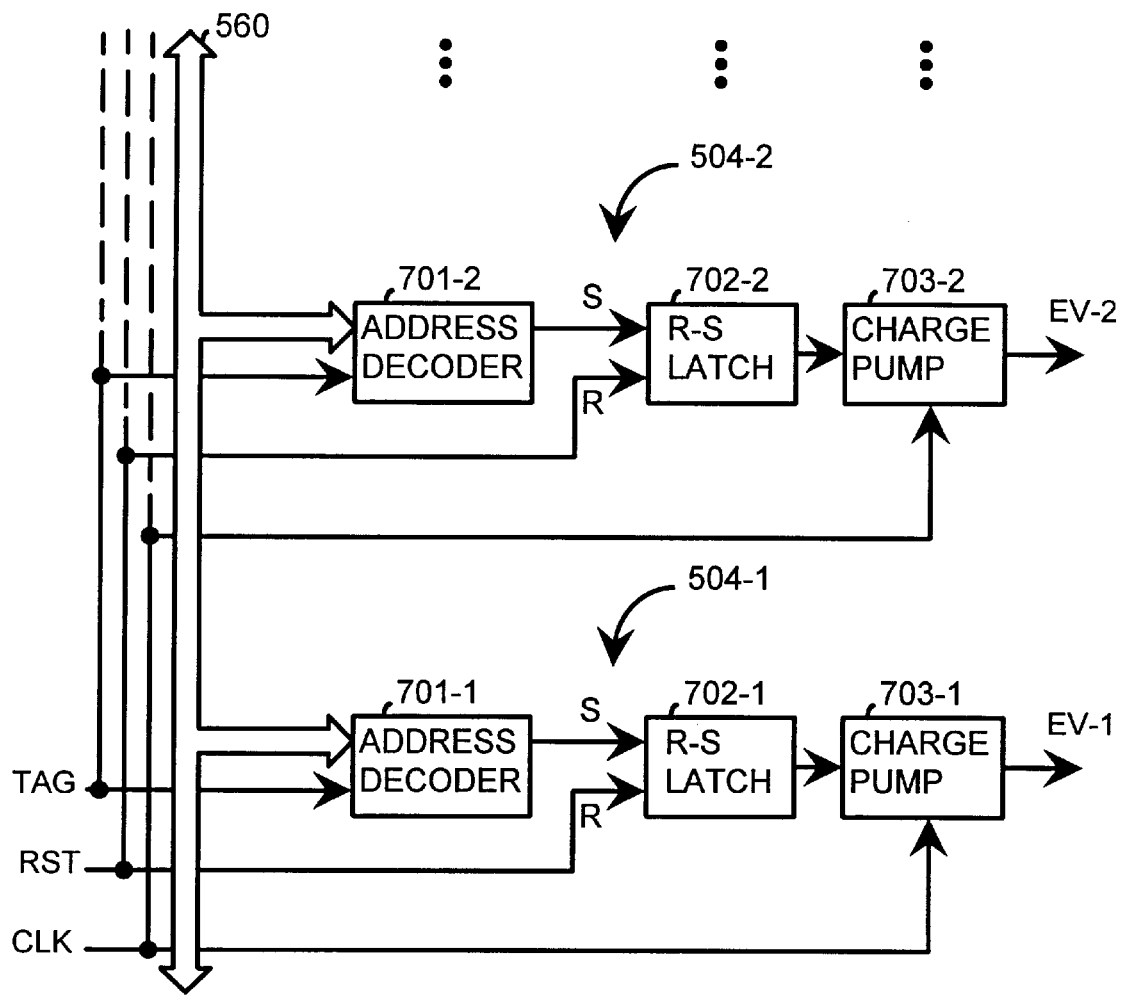
FIG. 7 illustrates, as an example, a block diagram of a representative one of the erase voltage generator circuits of FIG. 6, utilizing aspects of the present invention.

FIG. 7 illustrates, as an example, a block diagram of the plurality of erase voltage generating circuits, 504-1, 504-2 and so on, of the erase voltage generating circuitry 504. Included in individual erase voltage generating circuits (e.g., 504-1) are an address decoder (e.g., 701-1), an R-S latch (e.g., 702-1), and a charge pump circuit (e.g., 703-1). Prior to initiating an erase operation, a reset signal (RST) is activated resetting each of the R-S latches, 702-1, 702-2 and so on, of the plurality of erase voltage generating circuits, 504-1, 504-2 and so on, through their respective reset (R) inputs. Each of the address decoders, 701-1, 701-2 and so on, of the plurality of erase voltage generating circuits,

504-1, 504-2 and so on, has a plurality of inputs coupled to the address bus 560 and to a tag signal (TAG), and is conventionally constructed so that if the tag signal is activated and an address provided on the address bus 560 corresponds to one of the data sectors of its corresponding set of data sectors, then an output of the address decoder is placed in a high logic state (i.e., binary state "1"). Otherwise, the output of the address decoder is in a low logic state (i.e., binary state "0"). The output of each of the address decoders (e.g., 701-1) is coupled to a set input (S) of its corresponding R-S latch (e.g., 702-1), which operates in a conventional manner such that once set to the high logic state, it remains set in the high logic state until it is reset to the low logic state. The output of the R-S latch (e.g., 702-1) is coupled to its corresponding charge pump (e.g., 703-1) such that when the output of the R-S latch is in a high logic state and the charge pump is enabled through activation of a clock signal (CLK), the charge pump (e.g., 703-1) generates an erase voltage (e.g., EV1) suitable for erasing programmed states of the EEPROM cells of its corresponding set of data sectors (e.g., data sectors 604-1 to 604-8).

Figure 8:
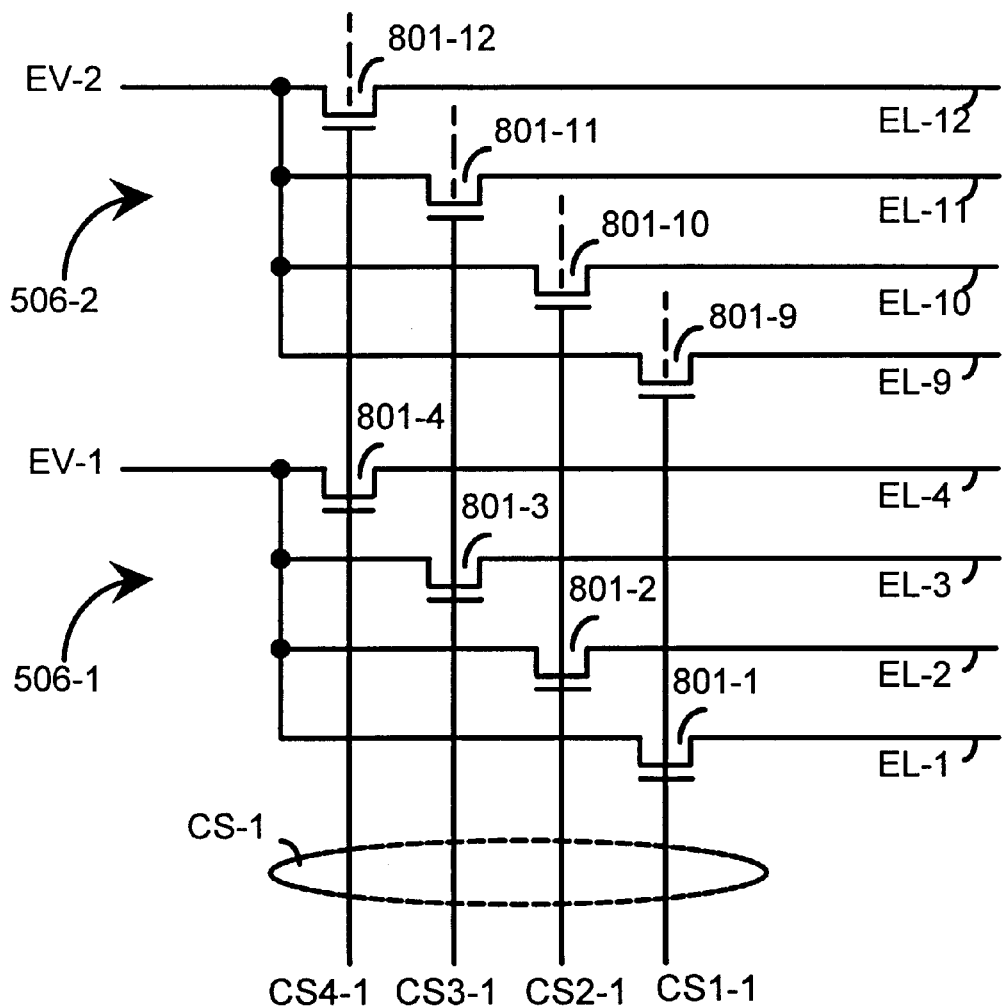
FIG. 8 illustrates, as an example, a circuit schematic for the left-side switch circuitry of FIG. 6, utilizing aspects of the present invention.

FIG. 8 illustrates, as an example, a circuit schematic for the plurality of switch circuits (e.g., 506-1, 506-2 and so on) comprising the left-side switch circuitry 506. Individual ones of the plurality of switch circuits (e.g., 506-1) comprise a plurality of switches (e.g., 801-1 to 801-4) coupling the generated erase voltage (e.g., EV-1) of their corresponding erase voltage generating circuit (e.g., 504-1) to selected data sectors (e.g., 604-1 to 604-4) of their corresponding lower half set of erase lines (e.g., EL-1 to EL-4) as determined by a corresponding one of the control signals CS-1 provided to its gate electrode. For example, if the control signal CS1-1 provided to the gate of the switch 801-1 is in a high logic state, then switch 801-1 turns on and couples the output of erase voltage generating circuit 504-1 to data sector 604-1 through erase line EL-1. Conversely, if the control signals, CS2-1 to CS4-1, provided to the gates of the switches 801-2 to 801-4 are in low logic states, then the switches 801-2 to 801-4 are turned off and do not couple the output of erase voltage generating circuit 504-1 to their corresponding data sectors, 604-2 to 604-4, through their corresponding erase lines, EL-2 to EL-4.

Corresponding switches of the plurality of switch circuits, 506-1, 506-4 and so on, form a column of switches having gates which are connected together and coupled to a corresponding one of the control signals CS-1. For examples, the switches (e.g., 801-1 and 801-9) coupled to the first data sector (e.g., 604-1 and 604-9) of each lower half of data sectors of each set of data sectors in the memory block 100-1 are connected together and coupled to a first one (CS1-1) of the control signals CS-1, to form a first column of switches; and the switches (e.g., 801-4 and 801-12) coupled to the last data sector (e.g., 604-4 and 604-12) of each lower half of data sectors of each set of data sectors in the memory block 100-1 are connected together and coupled to a last one (CS4-1) of the control signals CS-1, to form a last column of switches. Intermediate columns of switches are also formed, for example, as shown in FIG. 8.

Figure 9:
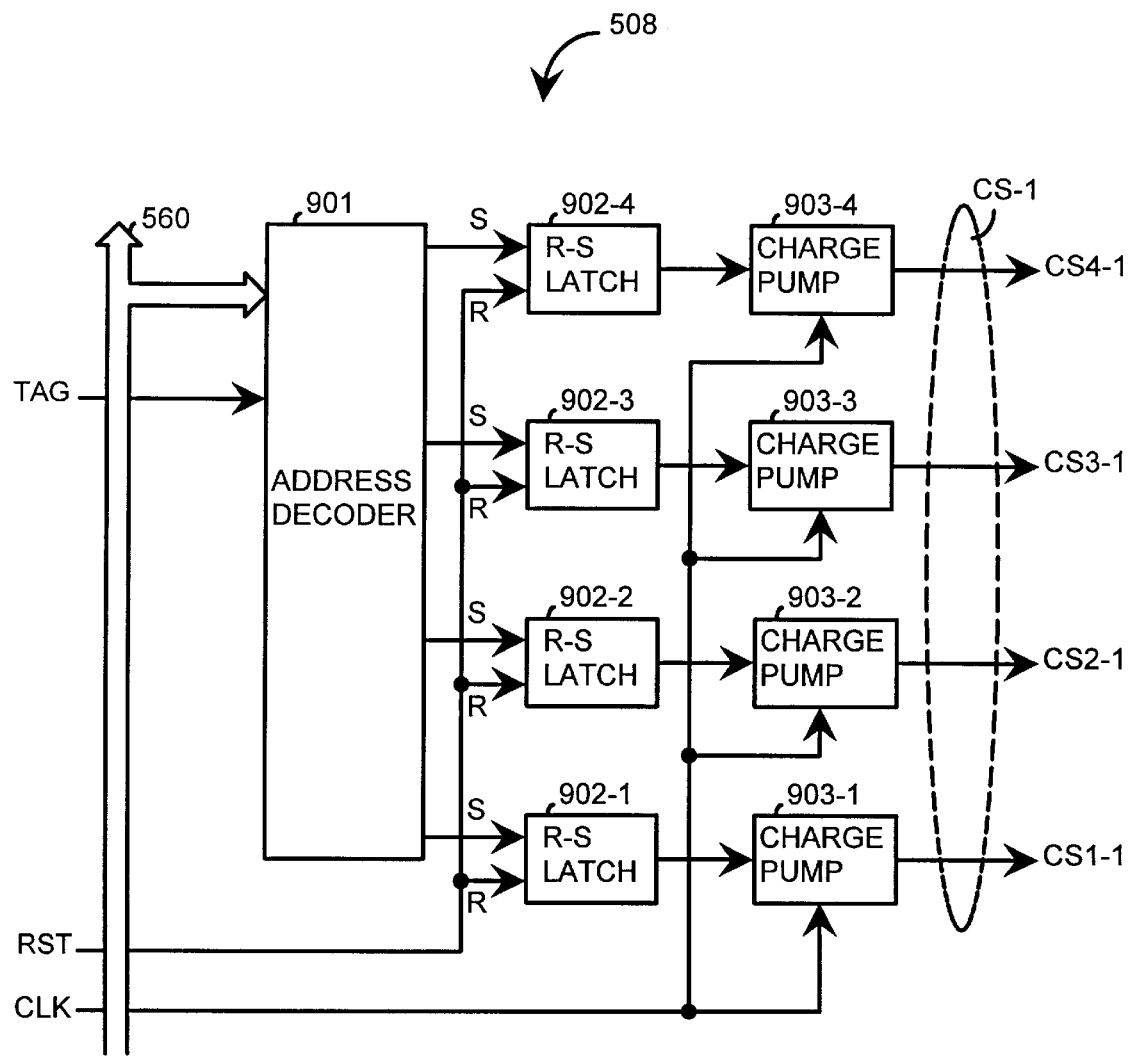
FIG. 9 illustrates, as an example, a block diagram of a representative one of the left and right switch control circuits of FIG. 6, utilizing aspects of the present invention.

FIG. 9 illustrates, as an example, the left-side switch control circuitry (edec) 508, which is constructed and operates the same as the right-side switch control circuitry 514. The left-side switch control circuitry (edec) 508 is shared by the left-side plurality of switch circuits, 506-1, 506-2 and so on, to reduce circuitry in the EEPROM device. Included in the left-side switch control circuitry 508 are an address decoder 901, a plurality of R-S latches (also referred to herein as "erase latches"), 902-1 to 902-4, which are reset along with R-S latches, 702-1, 702-2 and so on, of the erase voltage generating circuits, 504-1, 504-2 and so on, by the reset signal (RST) prior to initiating an erase operation. The address decoder 901 has a plurality of inputs coupled to the address bus 560, and a plurality of outputs coupled to corresponding set inputs (S) of the R-S latches, 902-1 to 902-4. Each of the R-S latches, 902-1 to 902-4, corresponds to a column of switches in the left-side switching circuitry 506. For examples, R-S latch 902-1 is coupled through charge pump 903-1 to the first column of switches including switches 801-1 and 801-9, and consequently, corresponds to the first column of switches; and R-S latch 902-4 is coupled to the last column of switches including switches 801-4 and 801-12, and consequently, corresponds to the last column of switches. The charge pumps, 903-1 to 903-4, generate the control signals CS-1 at voltages of sufficient magnitude to turn on selected ones of the switches of the left-side switch control circuitry 506.

Although the address decoders, 901 and 701-1, respectively of the left-side switch control circuitry 508 and the erase voltage generating circuit 504-1, are coupled to the same address bus 560, they decode different portions of a received address. As an example, for the preferred memory array configuration including two side-by-side half planes, each resembling, for example, plane 500-1, wherein each set of erase lines comprises sixteen erase lines (instead of the eight erase lines depicted in FIG. 6), an addressing scheme is defined such that the address decoder 901 decodes the three least-significant-bits (LSBS) of the received address indicating a selected one of the erase lines of the lower half of erase lines of each set of erase lines, and the address decoder 701-1 (and address decoders 701-2 and so on, in corresponding erase voltage generating circuits 504-2 and so on) decode bits from the fifth LSB on up, depending upon the size of the memory array. The fourth LSB indicates an address corresponding to either the lower half of erase lines of each set of erase lines (e.g., when it is "0"), or the upper half of erase lines (e.g., when it is "1").

Operational timing of the left-hand side erase circuitry depicted in FIG. 6 generally comprises the steps of sequentially providing on the address bus 560, for example, by a system processor (not shown), the addresses of data sectors to be erased, and after all such addresses have been provided, then enabling the charge pumps of the erase voltage generating circuitry 504 to generate erase voltages for concurrently erasing the selected data sectors. For example, if the data sectors 604-1 and 604-2 are to be simultaneously erased, the address corresponding to the data sector 604-1 is first provided on the address bus 560, causing the address decoders 901 and 701-1 to respectively set the R-S latches 902-1 and 702-1. Next, the address corresponding to the data sector 604-2 is provided on the address bus 560, causing the address decoder 901 to set the R-S latch 902-2. Although the address decoder 701-1 attempts to set the R-S latch 702-1, such attempt is ignored since the R-S latch 702-1 has already been set. Finally, to concurrently erase the data sectors 604-1 and 604-2, the clock signal (CLK) is activated so that the charge pump 703-1 generates an erase voltage EV-1 which is coupled through turned on switches 801-1 and 801-2 to the data sectors 604-1 and 604-2 through corresponding erase lines EL-1 and EL-2.

By sharing the left-side switch control circuitry 508 with all of the switching circuits, 506-1, 506-2 and so on, the number of the erase latches such as the R-S latches, 902-1 to 902-4, is significantly decreased, as compared to prior art systems, albeit at the expense of flexibility in selecting the data sectors to be concurrently erased. In particular, it is apparent that there are a number of combinations of data sectors that cannot be concurrently erased using the circuit depicted in FIG. 6. For example, data sectors 604-1 and 604-10 cannot be concurrently erased without also erasing data sectors 604-2 and 604-9.

FIGS. 10–19 illustrate, as examples, portions of a lay-out of the left plane 500-1 on an integrated circuit die. As a preface to the figures, however, it is useful to know that in certain virtual ground EEPROM array structures, the source and drain bit lines are implemented as buried diffusion bit lines to reduce the area taken up by the source and drain bit lines. To reduce the bit line series resistance of such a structure in high density memory arrays, metal lines are formed such that they make contact with corresponding ones of the buried diffusion bit lines through a series of metal contacts (vias) or other means at intervals along the buried diffusion bit lines. As a consequence, the memory blocks 100-1 and 100-2 may be physically partitioned into a number of segmented arrays. For example, a two-dimensional array with a total of 1024 rows may be partitioned into 32 segment arrays each including 32 rows. Further, the bit lines may also be partitioned into 32 independent bit-line segments with a gap spacing between adjacent array segments large enough to accommodate a metal contact or other means for making electrical contact between the buried diffusion bit line and its corresponding metal line.

Figure 10:
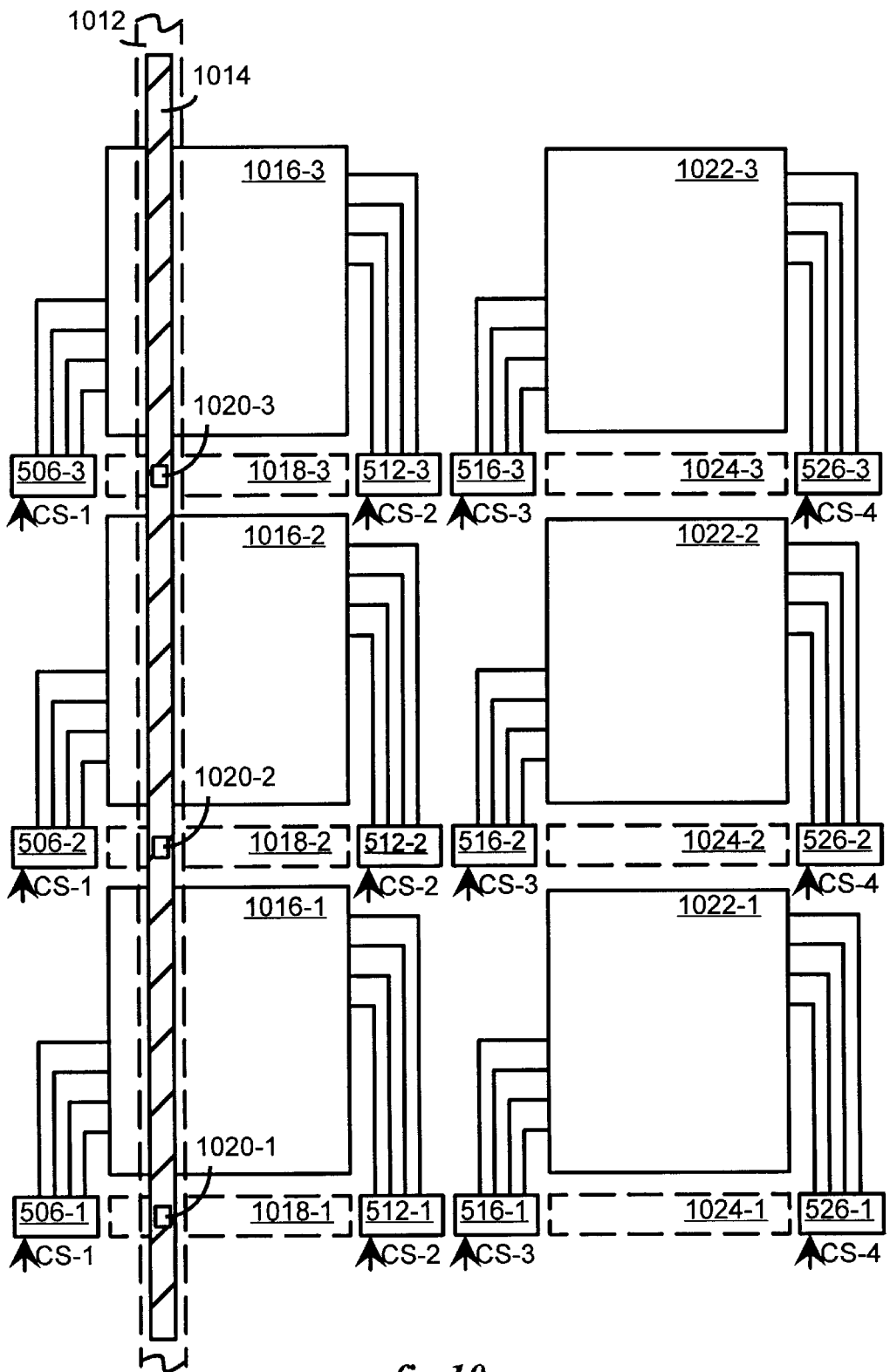
FIG. 10 illustrates, as an example, a simplified layout of the left plane portion of the high density EEPROM device of FIG. 5 including a representative diffused drain bit line and corresponding metal line, utilizing aspects of the present invention.

FIG. 10 illustrates, as an example, a simplified layout of part of the left plane 500-1 of the high density EEPROM device of FIG. 5, including a representative buried diffusion bit line 101-2 and corresponding metal line 101-4. In particular, memory block 100-1 is shown as being physically organized into segmented arrays appearing as sets of data sectors, 1016-1, 1016-2 and so on, and memory block 100-2 is shown as being physically organized into segmented arrays appearing as sets of data sectors, 1022-1, 1022-2 and so on. Although only a representative one of the buried diffusion bit lines is shown, it is to be understood that running parallel to it in the memory block 100-1, as well as in the memory block 100-2, are a number of identically constructed buried diffusion bit lines and their corresponding metal lines.

Metal contacts (e.g., 1020-1, 1020-2 and so on) are formed along the buried diffusion bit lines (e.g., 1012) before or after each segmented array of the memory blocks 100-1 and 100-2, so as to electrically connect the buried diffusion bit lines (e.g., 1012) to their corresponding metal lines (e.g., 1014). A row of such contacts is thus formed between each adjacent pair of top-and-bottom segmented arrays (e.g., 1061-1 and 1016-2) from corresponding contacts of the buried diffusion bit lines in the same memory block (e.g., 100-1). To accommodate such rows of contacts, corresponding elongated gap areas (e.g., 1018-1, 1018-2 and so on) reside between such adjacent pair of top-and-bottom segmented arrays (e.g., 1061-1 and 1016-2), extending in a parallel direction with the word and erase lines of the their corresponding memory block. If the buried diffusion bit lines are partitioned into independent bit line segments, then, in addition to such contacts, segment-select transistors may also be formed in such gap areas for selectively connecting such segmented bit lines. For additional details on segmented arrays, segmented bit lines or columns, and segment-select transistors, see, e.g., U.S. Pat. No. 5,315,541, entitled "Segmented Column Memory Array," which is incorporated herein by this reference.

Formed on the left and right of each of the gap areas are corresponding left-side and right-side switch circuits. For example, left-side switch circuits, 506-1, 506-2 and so on, are respectively formed adjacent to and on the left-side of corresponding ones of the gap areas, 1018-1, 1018-2 and so on, of the memory block 100-1, and right-side switch circuits, 512-1, 512-2 and so on, are respectively formed adjacent to and on the right-side of corresponding ones of the gap areas, 1018-1, 1018-2 and so on. Likewise, left-side switch circuits, 516-1, 516-2 and so on, are formed adjacent to and on the left-side of corresponding ones of the gap areas, 1024-1, 1024-2 and so on, of the memory block 100-2, and right-side switch circuits, 526-1, 526-2 and so on, are formed adjacent to and on the right-side of corresponding ones of the gap areas, 1024-1, 1024-2 and so on. A key feature of the lay-out of the switch circuitry 506, 512, 516 and 526 is that these circuitry are formed adjacent to their corresponding gap areas so as not to interfere with the word lines extending between corresponding rows of the memory blocks 100-1 and 100-2.

Metal lines providing control signals CS-1, CS-2, CS-3 and CS-4 run substantially parallel to the buried diffusion bit lines of the memory blocks 100-1 and 100-2, and respectively through their corresponding switch circuits. For example, control signals CS-1 are coupled to and pass through the left-side switch circuits, 506-1, 506-2 and so on, control signals CS-2 are coupled to and pass through the right-side switch control circuits, 512-1, 512-2 and so on, control signals CS-3 are coupled to and pass through the left-side switch circuits, 516-1, 516-2 and so on, and control signals CS-4 are coupled to and pass through the right-side switch control circuits, 526-1, 526-2 and so on.

Figure 12:
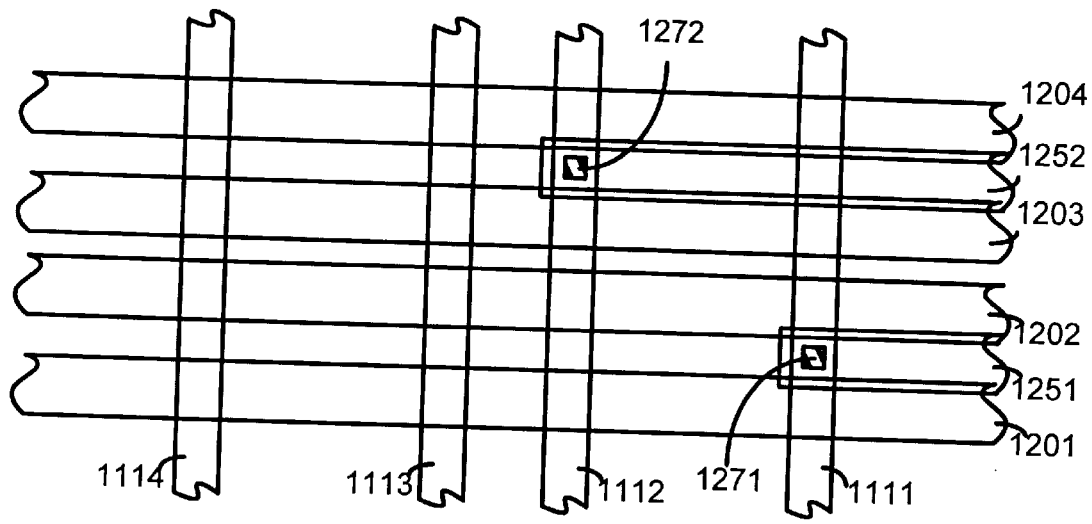
FIGS. 11 and 12 respectively illustrate, as examples, a simplified layout of a representative one of the left-side switch circuits, and corresponding erase lines of a first subarray coupled to the left-side switch circuit, utilizing aspects of the present invention.
Figure 11:
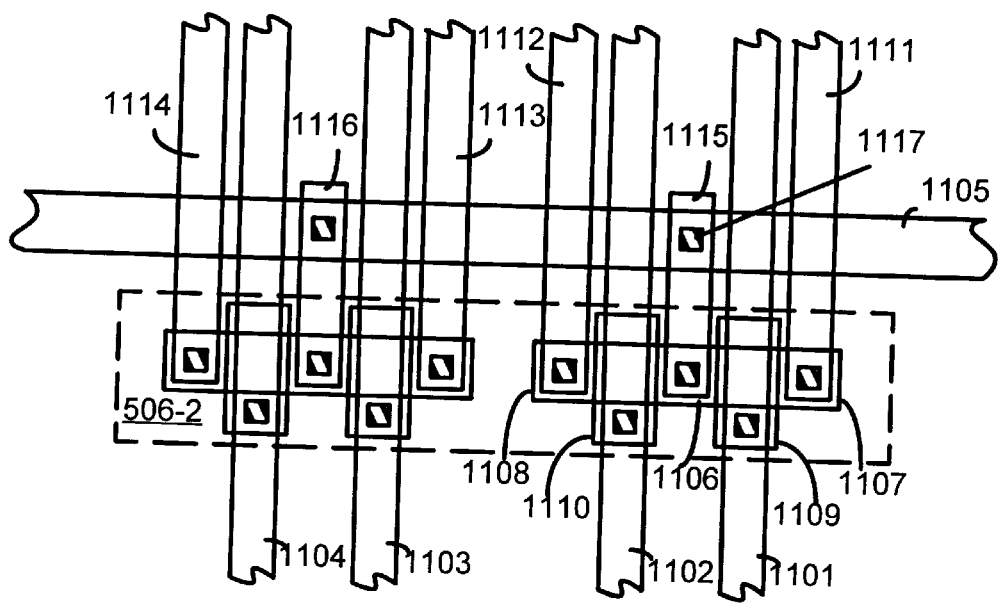

FIGS. 11 and 12 respectively illustrate, as examples, a simplified layout of the left-side switch control circuit 506-2 and its erase voltage, control signal, and erase lines connections, as a representative one of the left-side switch circuits, 506-1, 506-2 and so on, for the memory block 100-1. Referring first to FIG. 11, the left-side switch control circuit 506-2 is shown comprising four transistors formed in a gap area adjacent to and on the left-side of gap area 1018-2. First and second n-mos transistors are formed sharing a common drain region 1106 connected through a metal strap 1115 and contact 1117 to an erase voltage providing line formed of poly line 1105, which in turn, extends through the memory block 100-1 to corresponding right-side switch circuit 512-2, from the erase voltage generating circuit 504-2 formed on the left-hand side of the memory block 100-1. Likewise, third and fourth n-mos transistors are formed sharing a common drain region and are coupled through a corresponding metal strap 1116 and contact to the poly line 1105. The source regions of the first, second, third and fourth n-mos transistors are thereupon coupled to their corresponding erase lines through metal lines 1111, 1112, 1113, and 1114, and their control gates coupled to their corresponding control signal lines formed as metal lines 1101, 1102, 1103, and 1104, which in turn, are coupled to the left-side switch control circuitry 508. The four n-mos transistors, thus formed, function identically as transistors 801-9 to 801-12, as described in reference to FIG. 8.

In FIG. 12, connections of the metal lines, 1111 and 1112, respectively coupled to the sources of the first and second n-mos transistors of the left-side switch circuit 506-2, to corresponding erase lines, EL-9 and EL-10, formed respectively as poly lines, 1251 and 1252, are shown. Adjacent to each of the erase lines, are a pair of corresponding word lines. For example, erase line EL-9 formed as poly line 1251 is shown above and straddling a pair of word lines respectively formed as poly lines 1201 and 1202, and erase line EL-10 formed as poly line 1252 is shown above and straddling a pair of word lines respectively formed as poly lines 1203 and 1204. As previously explained, each word line is coupled to the control gates of a row of EEPROM cells, and each erase line is coupled to the erase gates of two adjacent rows of EEPROM cells.

Interpoly contacts, 1271 and 1272, are formed over the poly lines, 1251 and 1252, and beneath the metal lines, 1111 and 1112, to respectively couple the metal lines to the poly lines so as to connect the sources of the first and second n-mos transistors of the left-side switch circuit 506-2 to their respective erase lines. A key feature of these interpoly contacts (e.g., 1271) is their small diameter, allowing the width of their corresponding erase lines (e.g., 1251) to be minimal, and the spacing between corresponding word lines (e.g., 1201 and 1202) to also be minimal and consequently, minimizing the size of an integrated circuit die implementing the memory block 100-1.

Figure 14:
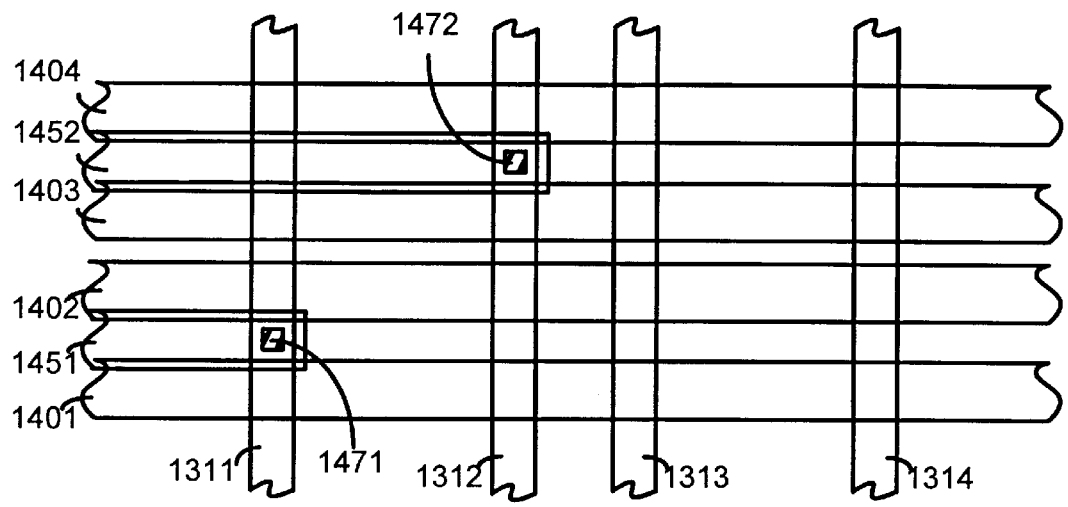
FIGS. 13 and 14 respectively illustrate, as examples, a simplified layout of a representative one of the right-side switch circuits, and corresponding erase lines of the first subarray coupled to the right-side switch circuit, utilizing aspects of the present invention.
Figure 13:
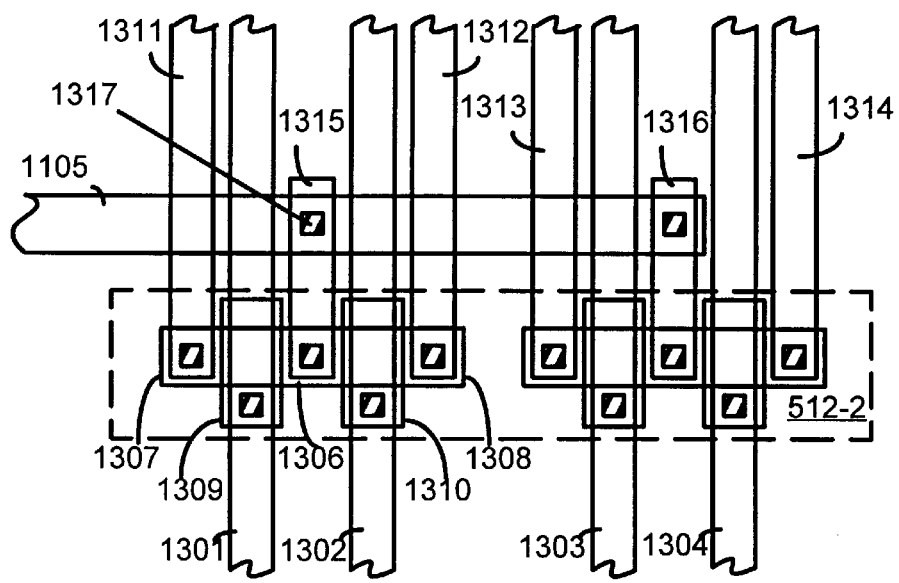

FIGS. 13 and 14 respectively illustrate, as examples, a simplified layout of the right-side switch control circuit 512-2 and its erase voltage, control signal, and erase lines connections, as a representative one of the right-side switch circuits, 512-1, 512-2 and so on, for the memory block 100-1. Referring first to FIG. 13, the right-side switch control circuit 512-2 is shown comprising four transistors formed in a gap area adjacent to and on the right-side of gap area 1018-2. First and second n-mos transistors are formed sharing a common drain region 1306 connected through a metal strap 1315 and contact 1317 to the poly line 1305 extended through the memory block 100-1 from the erase voltage generating circuit 504-2. Likewise, third and fourth nmos transistors are formed sharing a common drain region and are coupled through a corresponding metal strap 1316 and contact to the poly line 1305. The source regions of the first, second, third and fourth n-mos transistors are thereupon coupled to their corresponding erase lines through metal lines 1311, 1312, 1313, and 1314, and their control gates coupled to their corresponding control signal lines formed as metal lines 1301, 1302, 1303, and 1304, which in turn, are coupled to the right-side switch control circuitry 514.

In FIG. 14, connections of the metal lines, 1311 and 1312, respectively coupled to the sources of the first and second n-mos transistors of the right-side switch circuit 512-2, to corresponding erase lines, EL-13 and EL-14, formed respectively as poly lines, 1451 and 1452, are shown. Adjacent to each of the erase lines, are a pair of corresponding word lines. For example, erase line EL-13 formed as poly line 1451 is shown above and straddling a pair of word lines respectively formed as poly lines 1401 and 1402, and erase line EL-14 formed as poly line 1452 is shown above and straddling a pair of word lines respectively formed as poly lines 1403 and 1404. Interpoly contacts, 1471 and 1472, are formed over the poly lines, 1451 and 1452, and beneath the metal lines, 1311 and 1312, to respectively couple the metal lines to the poly lines so as to connect the sources of the first and second n-mos transistors of the right-side switch circuit 512-2 to their respective erase lines.

Figure 16:
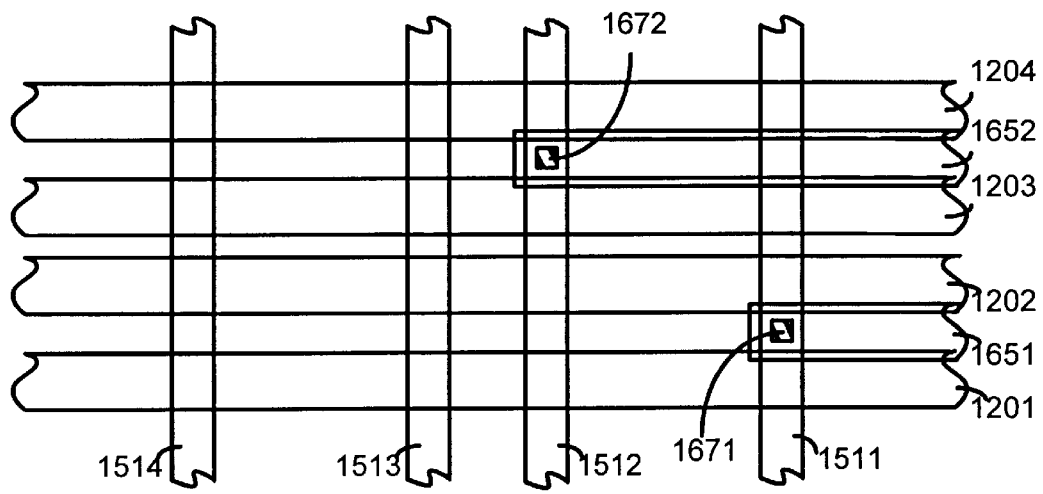
FIGS. 15 and 16 respectively illustrate, as examples, a simplified layout of another one of the left-side switch circuits, and corresponding erase lines of a second subarray sharing word lines with the first subarray and coupled to the left-side switch circuit, utilizing aspects of the present invention.
Figure 15:
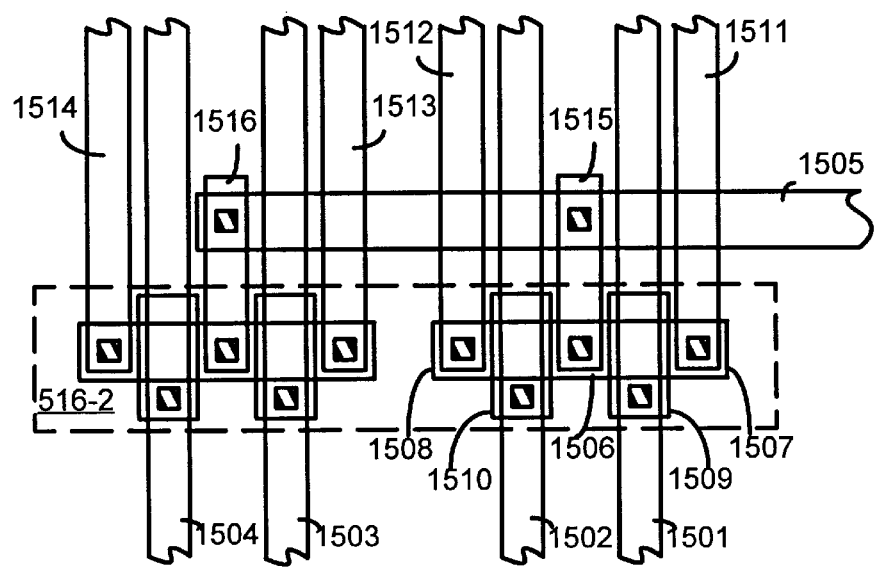

FIGS. 15 and 16 respectively illustrate, as examples, a simplified layout of the left-side switch control circuit 516-2 and its erase voltage, control signal, and erase lines connections, as a representative one of the left-side switch circuits, 516-1, 516-2 and so on, for the memory block 100-2. The construction and operation of the left-side switch control circuit 516-2 is generally identical to that of the left-side switch control circuit 506-2, therefore its description will be omitted to avoid unnecessary repetition.

Figure 18:
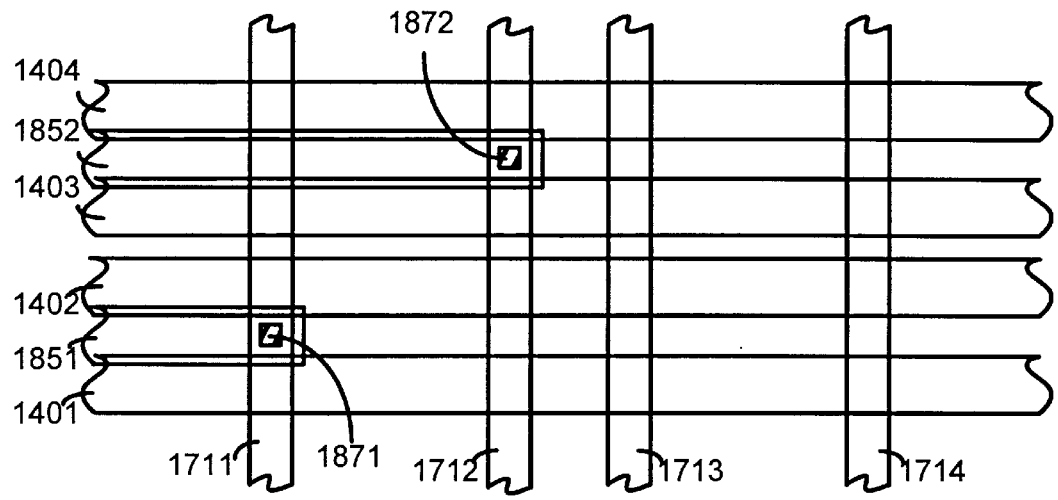
FIGS. 17 and 18 respectively illustrate, as examples, a simplified layout of another one of the right-side switch circuits, and corresponding erase lines of the second subarray coupled to the right-side switch circuit, utilizing aspects of the present invention.
Figure 17:
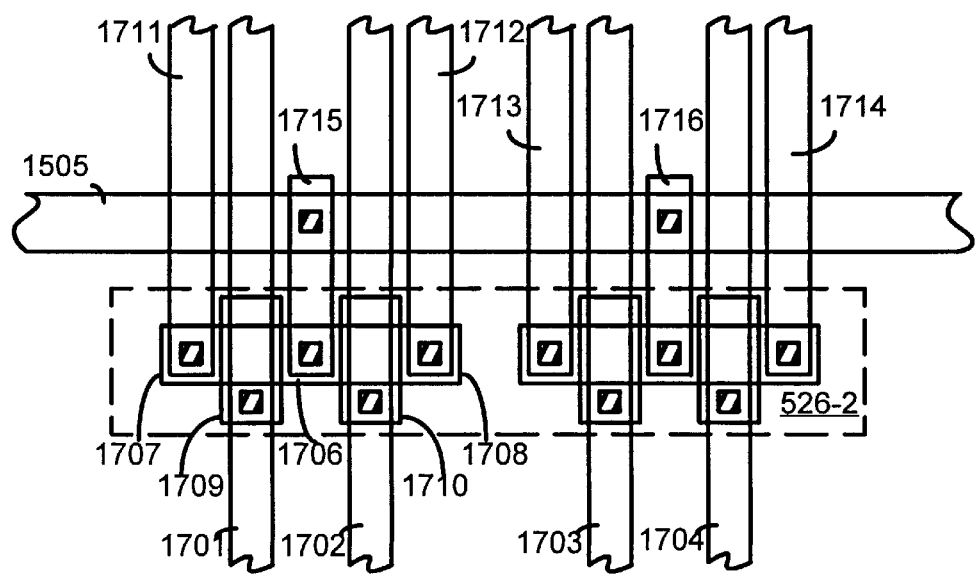

FIGS. 17 and 18 respectively illustrate, as examples, a simplified layout of the right-side switch control circuit 526-2 and its erase voltage, control signal, and erase lines connections, as a representative one of the right-side switch circuits, 526-1, 526-2 and so on, for the memory block 100-2. Since the construction and operation of the right-side switch control circuit 526-2 is generally identical to that of the right-side switch control circuit 512-2, its description will also be omitted to avoid unnecessary repetition.

Figure 19:
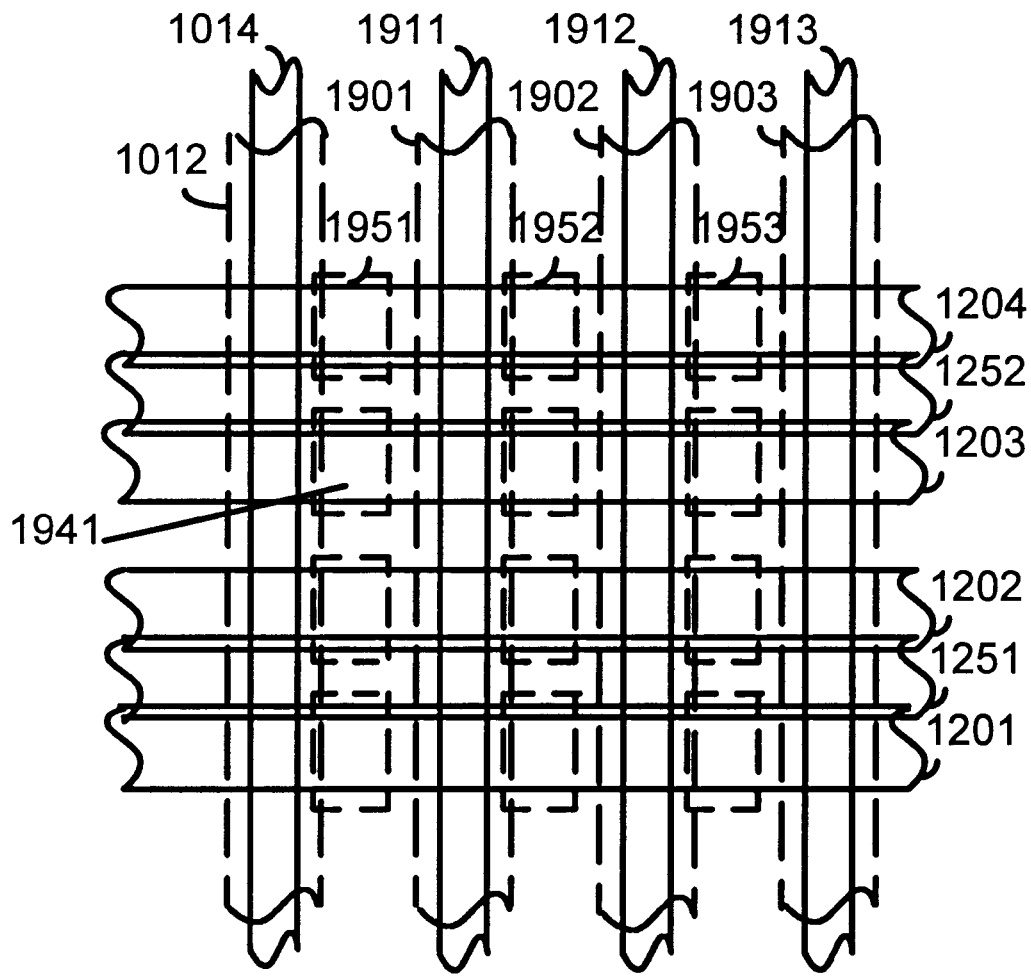
FIG. 19 illustrates, as an example, a portion of the first subarray corresponding to FIGS. 10–12, utilizing aspects of the present invention.

FIG. 19 illustrates, as an example, a portion of the lower EEPROM cell rows of the segmented array 1016-2 corresponding to the left-side switch circuit 506-2. In particular, a plurality of buried diffusion bit lines including the representative buried diffusion bit line 1012 and corresponding metal lines including the representative metal line 1014 are depicted therein, along with poly word lines, 1201-1204, poly erase lines, 1251 and 1252, and a corresponding plurality of floating gates including floating gates, 1951–1953 and 1941.

Each of the EEPROM cells is conventionally formed having source and drain regions, a control gate, and a floating gate. For example, a first EEPROM cell includes source and drain regions formed from portions of buried diffusion bit lines, 1014 and 1901, beneath the poly word line 1203, a control gate formed from a portion of the poly word line 1203 between the buried diffusion bit lines, 1014 and 1901, and a floating gate 1941. A second EEPROM cell includes source and drain regions formed from portions of buried diffusion bit lines, 1014 and 1901, beneath the poly word line 1204, a control gate formed from a portion of the poly word line 1204 between the buried diffusion bit lines, 1014 and 1901, and a floating gate 1951. The first and second EEPROM cells may then be concurrently erased by applying an appropriate erase voltage to the poly erase line 1252 while applying appropriate voltages to the source, drain and control gates of the first and second EEPROM cells. For examples and additional details of such conventionally constructed EEPROM cells, see, e.g., U.S. Pat. No. 5,198,380, entitled "Method of Highly Compact EPROM and Flash EEPROM Devices," which is incorporated herein by this reference.

Although the various aspects of the present invention have been described with respect to a preferred embodiment, it will be understood that the invention is entitled to full protection within the full scope of the appended claims.

What is claimed is:

1. A method of forming an EEPROM structure comprising:

forming a first diffusion region extending in a first direction on a semiconductor substrate;

forming a column of EEPROM cells sharing said first diffusion region such that said column of EEPROM cells includes a first and a second group of EEPROM cells separated by a group spacing greater than individual spacings between adjacent EEPROM cells of said first and second groups of EEPROM cells;

forming a plurality of transistors substantially along a line extending through said group spacing between said first and second groups of EEPROM cells in a second direction transverse to said first direction on said semiconductor substrate;

forming a first plurality of conductive strips extending in said second direction, and respectively connected to corresponding ones of said first plurality of EEPROM cells; and forming a second plurality of conductive strips connected to corresponding ones of said first plurality of conductive strips and to corresponding ones of said plurality of transistors.

2. The method as recited in claim 1, further comprising forming within said gap spacing between said first and second groups of EEPROM cells, a contact over and extending down to said first diffusion region.

3. The method as recited in claim 1, wherein said plurality of transistors forming step comprises forming a plurality of transistors individually having a drain, a source, and a gate, substantially along a line extending through said area of said first diffusion region in a second direction transverse to said first direction on said semiconductor substrate; and said second plurality of conductive strips forming step comprises forming a second plurality of conductive strips connected to corresponding ones of said first plurality of conductive strips and to the sources of corresponding ones of said plurality of transistors.

4. The method as recited in claim 1, wherein said first plurality of EEPROM cells forming step comprises forming outside of an area of said first diffusion region, a first plurality of EEPROM cells individually having an erase gate and including said first diffusion region; and said first plurality of conductive strips forming step comprises forming a first plurality of conductive strips extending in said second direction, and respectively connected to corresponding erase gates of said first plurality of EEPROM cells.

5. The method as recited in claim 4, further comprising:

forming a conductive strip extending in said second direction, and connected to an erase voltage;

forming a third plurality of conductive strips individually connected to said conductive strip connected to said erase voltage, and respectively connected to corresponding drains of said plurality of transistors.

6. The method as recited in claim 5, further comprising:

forming a selection circuit on said semiconductor substrate; and forming a fourth plurality of conductive strips individually connected to said selection circuit, and respectively connected to corresponding gates of said plurality of transistors.

7. The method as recited in claim 6, further comprising:

forming a second diffusion region extending in said first direction on said semiconductor substrate;

forming outside of an area of said second diffusion region, a second plurality of EEPROM cells individually having an erase gate and including said second diffusion region.

8. The method as recited in claim 7, wherein said plurality of transistors forming step comprises forming a plurality of transistors substantially along a line extending through said areas of said first and second diffusion regions in a second direction transverse to said first direction on said semiconductor substrate; and said first plurality of conductive strips forming step comprises forming a first plurality of conductive strips extending in said second direction, and respectively connected to corresponding erase gates of said first and second plurality of EEPROM cells.

* * * * *